(12) United States Patent
Yamamoto

(10) Patent No.: US 7,650,903 B2
(45) Date of Patent: Jan. 26, 2010

(54) FLUID CONTROLLER

(75) Inventor: Takashi Yamamoto, Nobeoka (JP)

(73) Assignee: Asahi Organic Chemicals Industry Co., Ltd., Nobeoka (JP)

( * ) Notice: Subject to any disclaimer, the term of this patent is extended or adjusted under 35 U.S.C. 154(b) by 0 days.

(21) Appl. No.: 11/661,506

(22) PCT Filed: Aug. 31, 2005

(86) PCT No.: PCT/JP2005/015943

§ 371 (c)(1),
(2), (4) Date: Jun. 4, 2008

(87) PCT Pub. No.: WO2006/025467

PCT Pub. Date: Mar. 9, 2006

(65) Prior Publication Data

US 2008/0294293 A1 Nov. 27, 2008

(30) Foreign Application Priority Data

Aug. 31, 2004 (JP) ............................ 2004-253501

(51) Int. Cl.
*F16K 31/128* (2006.01)
(52) U.S. Cl. .................................. 137/487.5; 251/61.2
(58) Field of Classification Search ............. 137/487.5, 137/492.5; 251/335.2, 61.2, 61.4
See application file for complete search history.

(56) References Cited

U.S. PATENT DOCUMENTS

| | | | | |
|---|---|---|---|---|
| 4,573,489 | A | * | 3/1986 | Carlton et al. ................ 137/59 |
| 4,872,638 | A | * | 10/1989 | Thompson et al. ............ 251/54 |
| 5,549,137 | A | | 8/1996 | Lenz et al. |
| 5,573,032 | A | | 11/1996 | Lenz et al. |
| 6,055,868 | A | * | 5/2000 | Koyano et al. ............ 73/861.28 |
| 6,386,509 | B1 | * | 5/2002 | Mastuzawa et al. ........ 251/61.3 |
| 6,539,968 | B1 | * | 4/2003 | White et al. ................... 137/10 |
| 7,108,241 | B2 | | 9/2006 | Yoshino et al. |
| 2005/0145278 | A1 | * | 7/2005 | Igawa et al. ................. 137/486 |
| 2006/0000509 | A1 | * | 1/2006 | Pozniak ................... 137/487.5 |

FOREIGN PATENT DOCUMENTS

| | | |
|---|---|---|
| JP | 1-134213 | 5/1989 |
| JP | 5-240370 | 9/1993 |

(Continued)

OTHER PUBLICATIONS

U.S. Appl. No. 11/661,576, filed Nov. 27, 2007, Adjustment Valve.

*Primary Examiner*—Stephen Hepperle
*Assistant Examiner*—William McCalister
(74) *Attorney, Agent, or Firm*—Jordan and Hamburg LLP

(57) ABSTRACT

A fluid controller that allows facilitated installment, piping and wiring connection to semiconductor manufacturing equipment and does not corrode even when a corrosive fluid is used, includes a flowmeter sensor section having a first ultrasonic transducer which transmits ultrasonic waves in a fluid and a second ultrasonic transducer which receives the ultrasonic waves transmitted from the first ultrasonic transducer and outputs the signal thereof to a flowmeter amp section. An adjustment valve that adjusts the flow rate of the fluid using operation pressure is provided, and at least the flowmeter sensor section and the adjustment valve are connected to and disposed in a casing having a fluid inlet and a fluid outlet.

8 Claims, 8 Drawing Sheets

FOREIGN PATENT DOCUMENTS

| | | |
|---|---|---|
| JP | 5-346185 | 12/1993 |
| JP | 6-83456 | 3/1994 |
| JP | 6-39294 | 10/1994 |
| JP | 9-502292 | 3/1997 |
| JP | 9-303609 | 11/1997 |
| JP | 11-161342 | 6/1999 |
| JP | 2001-125649 | 5/2001 |
| JP | 2001-153239 | 6/2001 |
| JP | 2001-242940 | 9/2001 |
| JP | 2004-038571 | 2/2004 |
| JP | 2004-164033 | 6/2004 |
| JP | 2004-240590 | 8/2004 |
| JP | 2004-302914 | 10/2004 |
| WO | WO-2004-006035 | 1/2004 |

* cited by examiner

PRIOR ART

PRIOR ART

FLUID CONTROLLER

BACKGROUND OF THE INVENTION

The present invention relates to a fluid controller to be used in fluid transport pipes requiring control of fluid, and more specifically, it relates to a fluid controller, an arrangement, piping and wiring connection of which, to semiconductor manufacturing equipment and the like, are easily achieved and do not corrode even when a corrosive fluid is used.

One of the processes used in semiconductor manufacturing is a wet etching process for etching a wafer surface using detergent water wherein a chemical solution of hydrofluoric acid or the like has been diluted with pure water. The concentration of the detergent water in this wet etching process must be controlled with high precision. Therefore, in recent years, a method for controlling the concentration of the detergent water with a flow ratio of pure water and a chemical solution has become mainstream, and a flow controller is used for controlling the flow rate of pure water or chemical solution with high precision.

Various flow controllers have been proposed conventionally, such as that shown in FIG. 7, which depicts a controller 151 of a pure water flow rate that performs fluid control when the pure water temperature is variable (see patent document 1, for example). This constitution is such that controller 151 comprises a flow rate adjustment valve 152, the aperture of which is adjusted in response to the operation of the operating pressure to adjust the pure water flow rate, an operation pressure adjustment valve 153 for adjusting the operating pressure provided by the flow rate adjustment valve 152, a flowmeter 154 for measuring the flow rate of pure water output from the flow rate adjustment valve 152, and an open/close valve 155 for allowing or blocking the flow of pure water through the flowmeter 154. By balancing operating pressure adjusted by the operation pressure adjustment valve 153 and output pressure of pure water in the flow rate adjustment valve 152, the fluid controller 151 uniformly controls the pure water flow output from the flow rate adjustment valve 152. In order that the measurement values by the flowmeter 154 are constant, there is provided a control circuit for performing feedback control of the operating pressure provided to the flow rate adjustment valve 152 from the operation pressure adjustment valve 153 based on the measurement values. Consequently, even if the output pressure in the flow rate adjustment valve 152 changes following a temperature change of the pure water, since the pure water flow rate output from the flow rate adjustment valve 152 is adjusted by adjusting in real time the operating pressure in correspondence to the change, the pure water flow rate can be maintained at a constant value with high precision.

Further, as a module for performing fluid control, there is a fluid control module 156 connected in-line with a fluid channel for transporting a fluid, as shown in FIG. 8. (For example, see patent document 2.) This constitution is such that a module comprises a housing 157 having a chemically inactive flow channel, an adjustable control valve 158 connected to the flow channel, a pressure sensor 159 connected to the flow channel, and a diaphragm section 160 positioned in the flow channel, wherein the control valve 158 and pressure sensor 159 are accommodated in the housing 157. A driver 161 having a mechanical, electrical or air-powered constitution for driving the control valve 158 and a controller 162 electrically connected to the control valve 158 and pressure sensor 159 are also accommodated in the housing 157. The effect is such that the flow rate in the flow channel is measured from the pressure difference measured in the fluid circuit and the diameter of the diaphragm section 160 and the control valve 158 is subject to feedback control and driven based on the measured flow rate, thereby deciding the flow rate in the flow channel with high precision.

Patent document 1: Laid-Open Japanese Patent Application No. H11-161342

Patent document 2: Laid-Open Japanese Patent Application No. 2001-242940

However, because a conventional pure water flow rate controller 151 is divided into many constituent elements, during installation in semiconductor manufacturing equipment, etc., pipe connections, electrical wiring or air pipe work must be performed respectively for each constituent element, resulting not only in time needed for complex tasks, but also possible errors in piping or wiring. Furthermore, other problems arise, such as pressure loss caused by connection parts when pipes are connected via tubes or joints, and this pressure loss impacts flowmeter measurements, which leads to greater measurement error, which in turn makes it difficult to control the flow rate accurately. Further, if a corrosive fluid is used, the parts in the flowmeter 154 may corrode due to infiltration by a corrosive gas.

In the conventional fluid control module 156, if a corrosive fluid is used as the fluid, the controller 162 or driver 161 will corrode when an infiltrating gas fills the fluid control module 156, affecting flowmeter measurements or functioning of the flow rate control, preventing accurate control of the flow rate or, at worst, resulting in damage. Even if the malfunction of the module is caused by corrosion of the controller 162 or driver 161, because the fluid control module 156 is designed with the various components integrated, it is difficult to repair or replace the components separately; the entire module must be replaced, resulting in higher costs in repairing damage. Further, there is the problem that if the fluid flowing into the fluid controller has a fast pulse in a pressure variable cycle, the control valve 158 operates so as to control the flow rate with respect to the pulsed fluid. However, hunting occurs and the flow rate cannot be controlled. If this state continues, the driver 161 and control valve 158 will ultimately be damaged.

SUMMARY OF THE INVENTION

The present invention was conceived in view of the above problems of the conventional art, and its object is to provide a fluid controller for which installation, piping and wiring connection to semiconductor manufacturing equipment, etc. are easily implemented, which lowers pressure loss caused by wiring connections, and for which changing the disposal of any module is facilitated. Further objects are to provide a fluid controller for which installation, piping and wiring connection to semiconductor manufacturing equipment which do not corrode even if a corrosive fluid is used as the fluid, and which can control the flow rate even if the inflow of fluid is in pulses.

The fluid controller for resolving the above issues will be explained based on FIGS. 1 and 2. A first aspect of the invention is a fluid controller provided with a flowmeter sensor section 4 having a first ultrasonic transducer 12 that transmits ultrasonic waves throughout the fluid, and a second ultrasonic transducer 13 that receives ultrasonic waves transmitted from the first ultrasonic transducer 12 and outputs the signal into the flowmeter amp section 58, and an adjustment valve 5 for adjusting the flow rate of the fluid using operating pressure, wherein at least the flowmeter sensor section 4 and the adjustment valve 5 are connected to each other in the inner portion of a single casing 2 having a fluid inlet 3 and fluid outlet 6.

A second aspect of the invention is a fluid controller divided into two, namely, a valve module 1 comprising a flowmeter sensor section 4 and an adjustment valve 5 disposed in a single casing 2, and an electronic module 56 comprising a flowmeter amp section 58 which calculates the flow volume using the signal of the flowmeter sensor section 4, an electropneumatic transducer 60 which adjusts the operating pressure of the adjustment valve 5, and a control section 59 which adjusts the operating pressure and performs feedback control based on the flow rate volume calculated by the flowmeter amp section 58 disposed in a single casing 57.

A third aspect of the invention is a fluid controller having integrally fitted therein, a main body 14 having a valve chamber 23 at an upper portion thereof, an inflow channel 24 and outflow channel 25 that respectively communicate with the valve chamber 23, and, at the bottom center of the valve chamber, an opening 26 with which the outflow channel 25 communicates. A cylinder 15 is provided with a through-hole 28 at the bottom center thereof, and a ventilation hole 29 in the lateral surface, the cylinder 15 and main body 14 sandwiching and fixing a first diaphragm 17 therebetween. A bonnet 16 is provided with a working fluid communication hole 30 on the upper portion thereof, the bonnet 16 and cylinder 15 sandwiching and fixing the peripheral edge of a second diaphragm 19 therebetween, wherein the first diaphragm 17 comprises a shoulder section 32, an attachment section 33 positioned above the shoulder section 32 and engaging with and fixing the bottom of the rod 20 (described below). A joining section 45 is positioned below the shoulder section 32 to which a valve body 18 (described later) is fixed; a thin wall section 34 radially extending from the shoulder section 32. A thick wall section 35 consecutive with the thin wall section 34, and a seal section 36 provided at the peripheral edge of the thick wall section 35, the aforementioned parts being integrally formed; and the valve body 18, which enters and exits from the opening 26 of the valve chamber 23 in response to the vertical movement of a rod 20, is fixed to the joining section 45. The second diaphragm 19 has a central hole 37, and comprises an integrally formed thick wall section 38 around such hole, thin wall section 39 radially extending from the thick wall section 38, and seal section 40 provided at the peripheral edge of the thin wall section 39. The second diaphragm 19 is sandwiched and fixed by a diaphragm hold-down member 21 that penetrates the central hole 37 to the shoulder section 42 positioned at the upper portion of the rod 20 to the bottom of which the attachment section 33 of the first diaphragm 17 is attached so that the second diaphragm 19 and the rod 20 is disposed such that the lower part thereof is disposed in the through-hole 28 in the bottom of the cylinder 15 with play, and is supported by a spring 22 engaged between the step section 48 of the cylinder 15 and the bottom surface of the shoulder section 42 of the rod 20 in a state such that radial movement is prevented.

A fourth aspect of the invention is a fluid controller wherein cables 64, 65 connecting a flowmeter sensor section 4 of the valve module 1 and the flowmeter amp section 58 of the electronics module 56 are detachable via connectors 53, 54, 61 and 62.

A fifth aspect of the invention is a fluid controller wherein a connector box 50 is provided in a substantially sealed state in the casing 2 of the valve module 1, and a ventilation hole 51 that communicates with a discharge port 31 of the adjustment valve 5 in the connector box 50, and an exhaust hole 52 that communicates with the exterior of the casing 2 are provided.

A sixth aspect of the invention is a fluid controller serving as an ultrasonic flowmeter comprising, in series, an inflow channel 7 that communicates with a fluid inlet 3, a first startup flow channel 8 extending perpendicular from the inflow channel 7, a linear flow channel 9 that communicates with the first startup flow channel 8 and provided roughly parallel to the inflow channel 7, a second startup flow channel 10 extending orthogonally from the linear flow channel 9, and an outflow channel 11 that communicates with the second startup flow channel 10, and which is roughly parallel to an axis line of the inflow channel 7, and communicates with the inflow channel 24 of the adjustment valve 5. At a position of an intersection with the axis line of the linear flow channel 9 of a side wall of the first and second startup flow channels 8 and 10, a flowmeter comprising a flowmeter sensor section 4 comprising ultrasonic transducers 12 and 13 disposed so as to face each other, and a flowmeter amp section 58 to which the pair of ultrasonic transducers 12 and 13 are connected via cables 64, 65 calculates the flow rate of the fluid flowing through the linear flow channel 9 alternatingly switching between transmitting and receiving signals of the pair of ultrasonic transducers 12 and 13 and measuring the difference in ultrasonic wave propagation time between the respective ultrasonic transducers 12 and 13.

A seventh aspect of the invention is a fluid controller serving as an ultrasonic type vortex flowmeter, wherein a flowmeter comprising a flowmeter section 68 comprising, in series, an inflow channel 71 which communicates with the fluid inlet 3, a vortex generation body 72 disposed orthogonally in the inflow channel 71 for generating a Karman vortex, and a linear flow channel 74 provided with an outflow channel 73, and at a side wall on the downstream side of the vortex generation body 72 of the linear flow channel 74, a pair of ultrasonic transducers 75, 76 disposed opposite each other at a position orthogonal to the flow channel axial direction, and a flowmeter amp section 80 to which these ultrasonic transducers 75, 76 are connected via cables 86 and 87 calculates flow rate using the phase difference between a signal that one ultrasonic transducer has transmitted and a signal that the other ultrasonic transducer 76 has received for the generated frequency of the Karman vortex generated in the downstream of the vortex generation body 72.

An eighth aspect of the invention is a fluid controller, such that the inner portion of the casing 57 of the electronics module 56 is substantially tightly sealed and has a discharge outlet 67 used only for discharging air that has filled the inner portion of the casing 57.

A ninth aspect of the invention is a fluid controller provided with a pressure control valve 88 on an internal or external part of the fluid inlet 3 of the valve module 1.

In the present invention, it is sufficient if at least the flowmeter sensor section 4 and the adjustment valve 5 are connected inside a single casing 2. This allows a compact fluid controller to be provided by integrating the flowmeter sensor section 4 and adjustment valve 5, making connecting pipes easy, and because few joints or the like are used in the configuration, reducing pressure loss caused by connecting parts.

No particular limitations are imposed with respect to the adjustment valve 5, provided that the flow rate can be adjusted using operating pressure. However, a constitution having the adjustment valve 5 of the present invention is preferred, and adjustment of the flow rate is made easy by introducing a working fluid into the working fluid communication hole 30, and the flow rate of a fluid can be adjusted to a desired rate over a broad range. Further, because the receiving pressure area of the thin wall section of the first diaphragm 17 is significantly smaller than the receiving pressure of the thin wall section of the second diaphragm 19, even if the pressure of the fluid from the inflow channel 24 changes, the fluid pressure does not easily affect the adjustment valve and hunting is inhibited. Also, because the lower part of the rod 20 is engaged with the through hole of the lower portion of the cylinder 15 with play, responsiveness of fluid control for changing the flow rate in the pipes is excellent. Furthermore, because there are no sliding parts, chafing through wear and tear or the resulting dross does not occur. The spring 22, which, among the parts of the adjustment valve 5 is a part that would be subject to corrosion, is prevented from corroding because the entire surface is covered with a fluoride resin.

Further, while in the present invention, the flowmeter sensor section 4 of the valve module 1 may be directly connected by cables 64, 65 with the flowmeter amp section 58 of the electronics module 56, it is preferable that the flowmeter sensor section 4 and the flowmeter amp section 58 be connected by cables 64, 65 via the connectors 53, 54 linked to the flowmeter sensor section 4 and the connectors 61, 62 linked to the flowmeter amp section 58. Only the connectors 53, 54 linked to the flowmeter sensor section 4 may be provided, only the connectors 61, 62 connected to the flowmeter amp section 58 may be provided, or both may be provided. With such a constitution, the cables 64, 65 can be detachably connected via the connectors, and wiring connections of the flow controller is easy and can be performed in a short amount of time, and the disposition of any module can be changed easily.

A connector box 50 may be provided to the casing 2 of the valve module 1 of the present invention. An inert gas or air discharged from the discharge port 31 of the adjustment valve 5 is supplied from the intake port 51 of the connector box 50 to the interior of the connector box 50, and discharged from the exhaust hole 52. Therefore, even when a corrosive gas passes through the interior of the connector box 50 when a corrosive fluid is used as a fluid, the gas is discharged riding on the air flow from the intake port 51 to the exhaust hole 52, so that it does not accumulate within the connector box 50, thus preventing corrosion of the connectors 53, 54.

While no particular restrictions are placed with respect to the flowmeter comprising the flowmeter sensor section 4 and the flowmeter amp section 58, provided the measured flow rate is converted to an electric signal and output to the control section 59, preferably it is an ultrasonic flowmeter or ultrasonic-type vortex flowmeter, and more preferably it is a flowmeter having a constitution of the ultrasonic flowmeter or ultrasonic-type vortex flowmeter of the present application. In the case of an ultrasonic flowmeter of the present invention, because flow measurements of a minute flow rate can be made with good precision, this invention is suitable for fluid control of a minute flow rate. In the case of an ultrasonic-type vortex flowmeter in accordance with the present invention, because a high flow rate can be measured with good precision, this invention is suitable for fluid control of a large flow. With such a constitution, flow control with good precision can be performed by using an ultrasonic flowmeter or ultrasonic-type vortex flowmeter, depending on the fluid flow rate.

The material parts for the casing 2, fluid inlet 3, the parts of the flowmeter sensor section 4, the parts of the adjustment valve 5, the fluid outlet 6, and the casing 57 of the electronics module 56 excluding ultrasonic transducers 12 and 13, any one of polyvinyl chloride (PVC), polypropylene, or polyethylene, may be used as long as it is resin, but particularly if a corrosive fluid is used, polytetrafluoroethylene (PTFE), polyvinylidene fluoride (PVDF), tetrafluoroethylene perfluoroalkoxy vinyl ether copolymer resin (PFA) or other fluorine resin is preferable. With a fluorine resin, there is no need to be concerned about the corrosion of each part when a corrosive gas passes through.

While the valve module 1 of the present invention is provided with the fluid inlet 3, flowmeter sensor section 4, adjustment valve 5, and fluid outlet 6, provided they are made of material that will not corrode, open/close valves, temperature gage, or other pipe members may also be provided. Also, while the electronics module 56 is provided with the flowmeter amp section 58, control section 59 and electropneumatic transducer 60, other electronic parts may be provided.

DETAILED DESCRIPTION OF THE INVENTION

Figure 1:
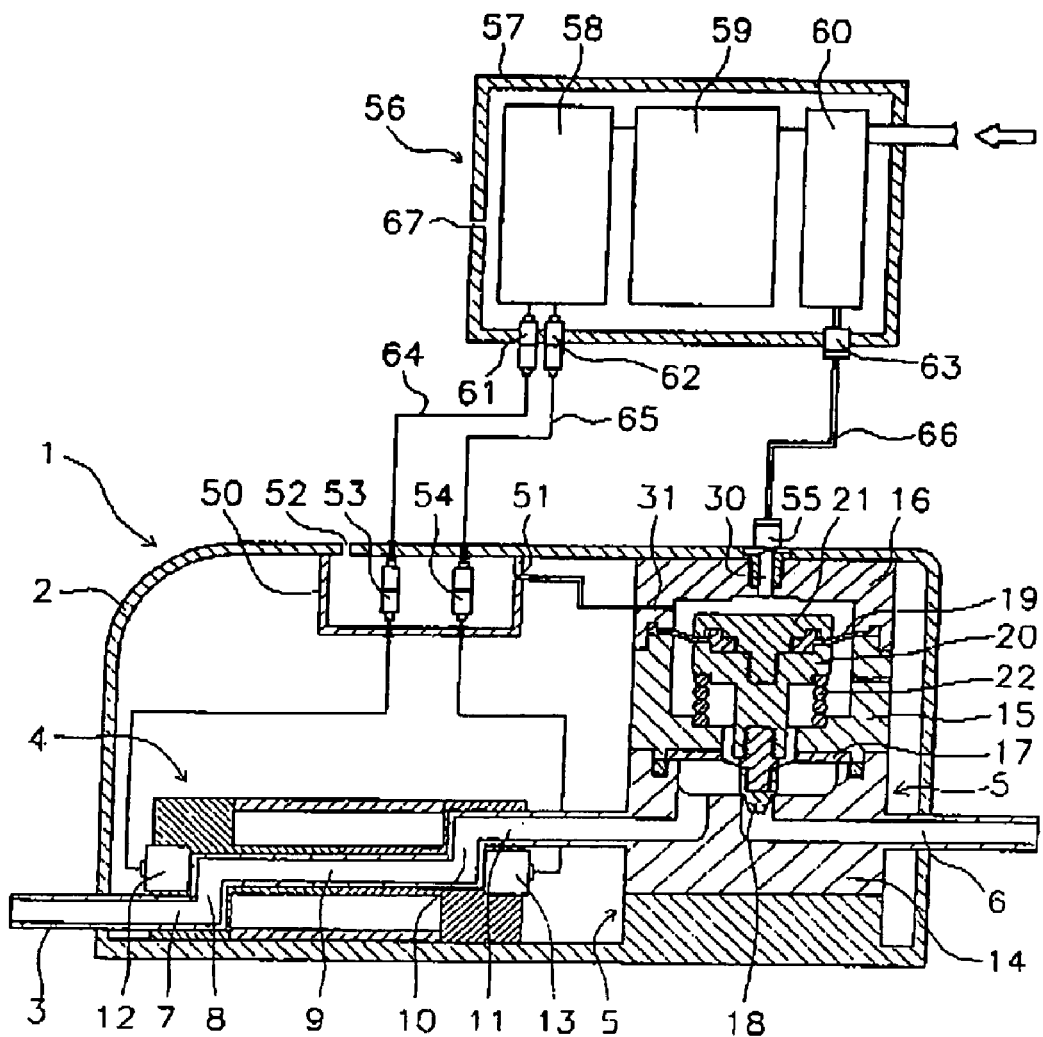
FIG. 1 is a vertical cross-sectional view showing one embodiment of the fluid controller according to the present invention.
Figure 2:
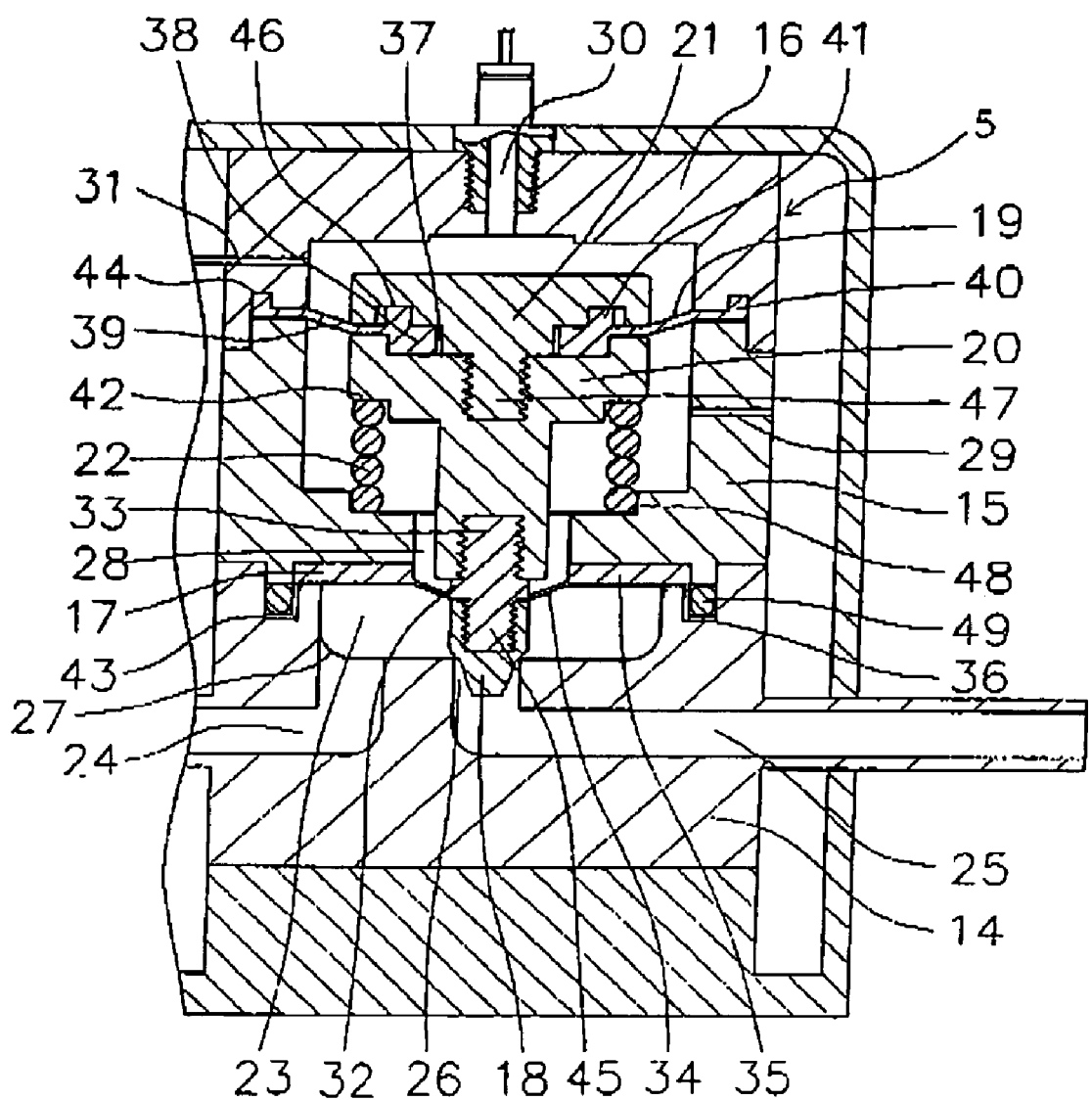
FIG. 2 is an enlarged view of essential components of the adjustment valve of FIG. 1.
Figure 3:
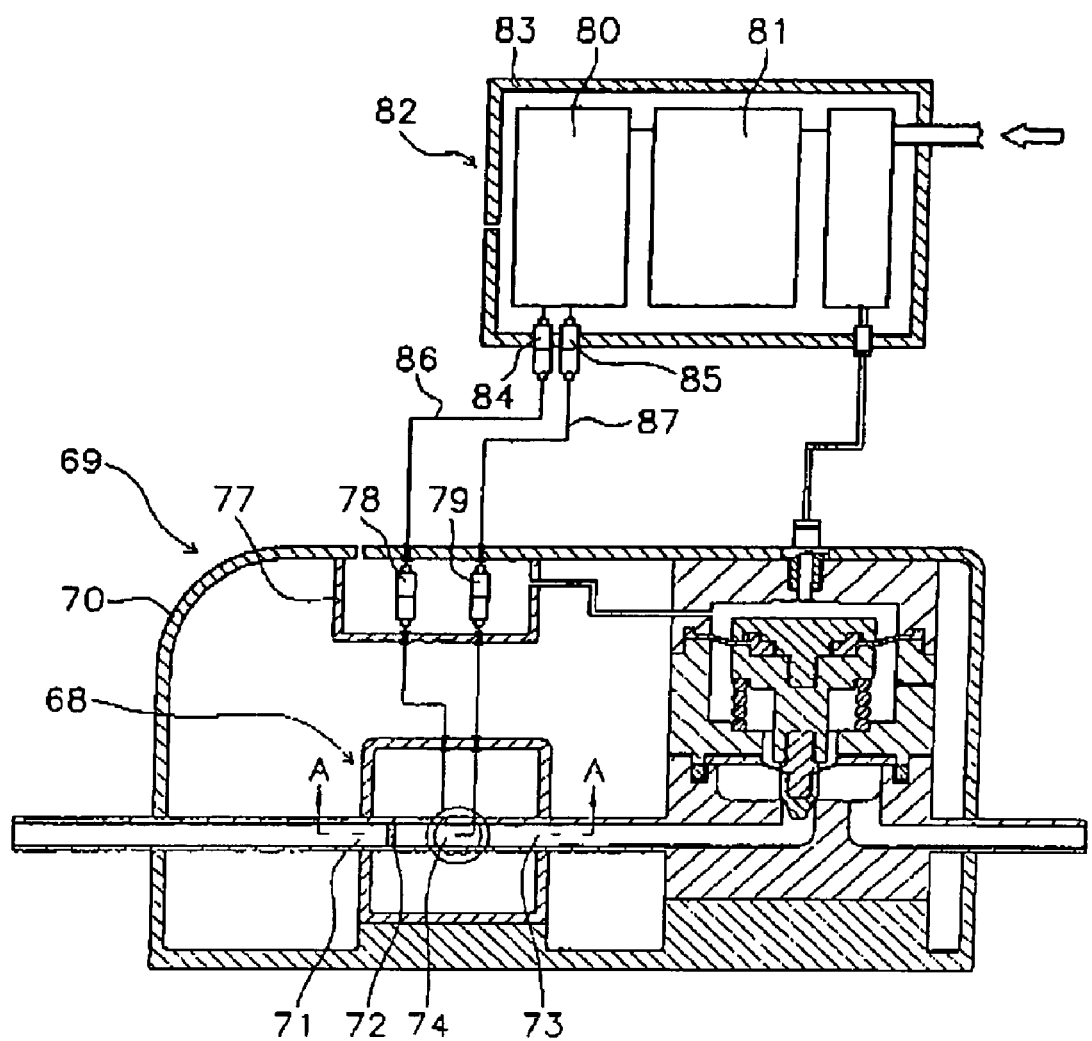
FIG. 3 is a vertical cross-sectional view showing a second embodiment of the fluid controller according to the present invention.
Figure 4:
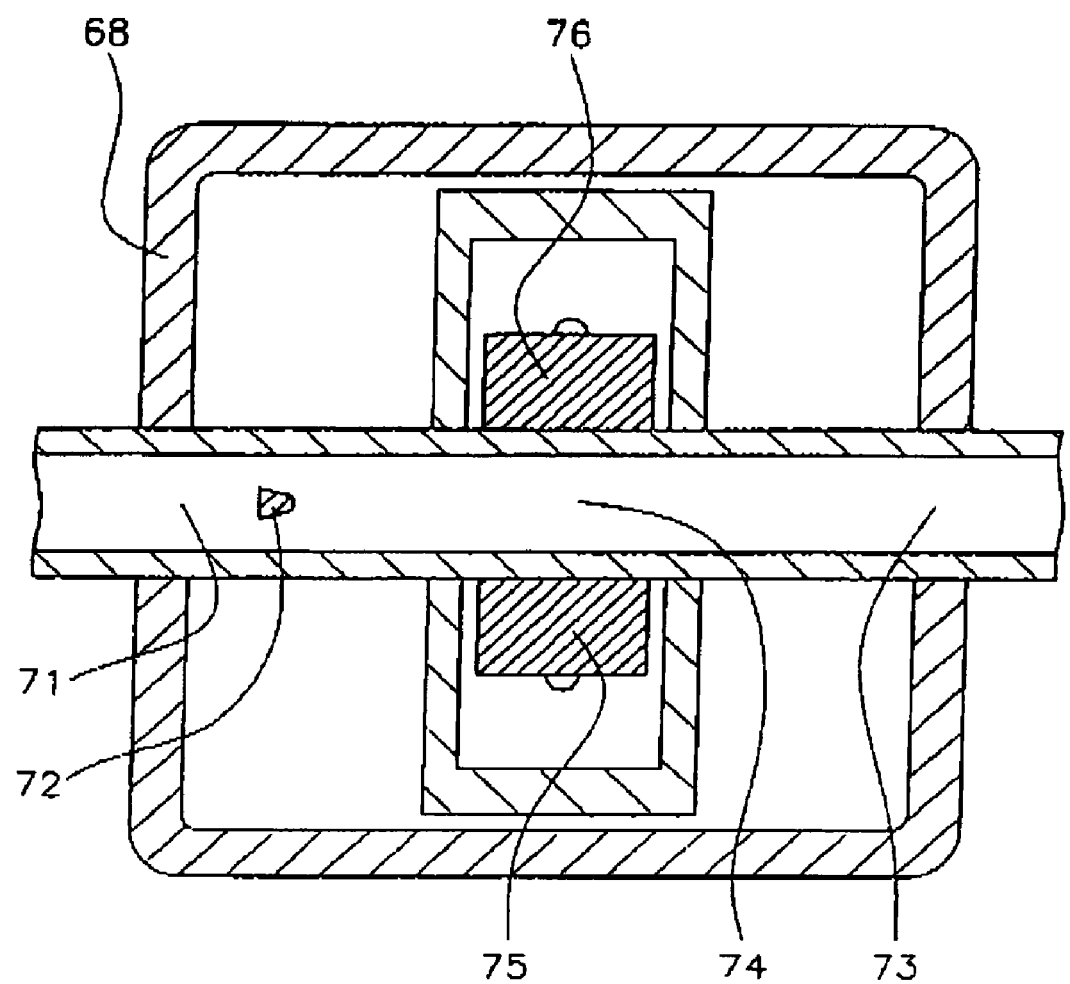
FIG. 4 is a cross-sectional view along the A-A line of FIG. 3.
Figure 5:
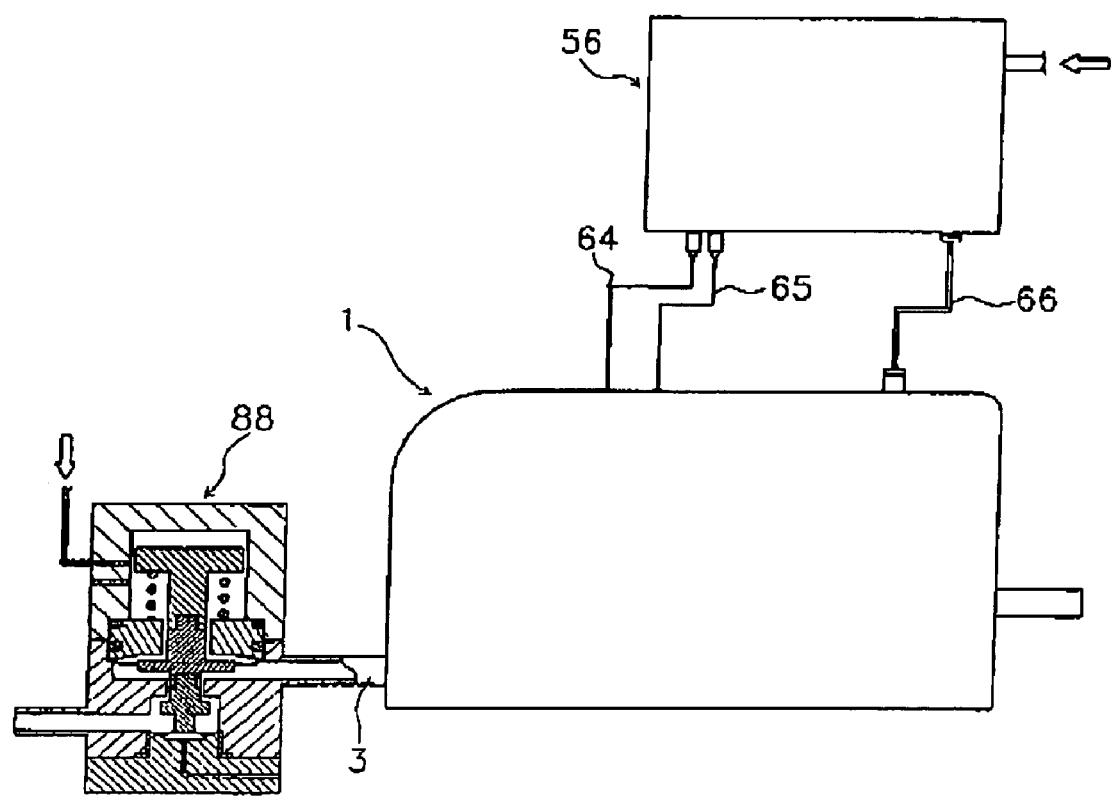
FIG. 5 is a vertical cross-sectional view showing a third embodiment of the fluid controller according to the present invention.
Figure 6:
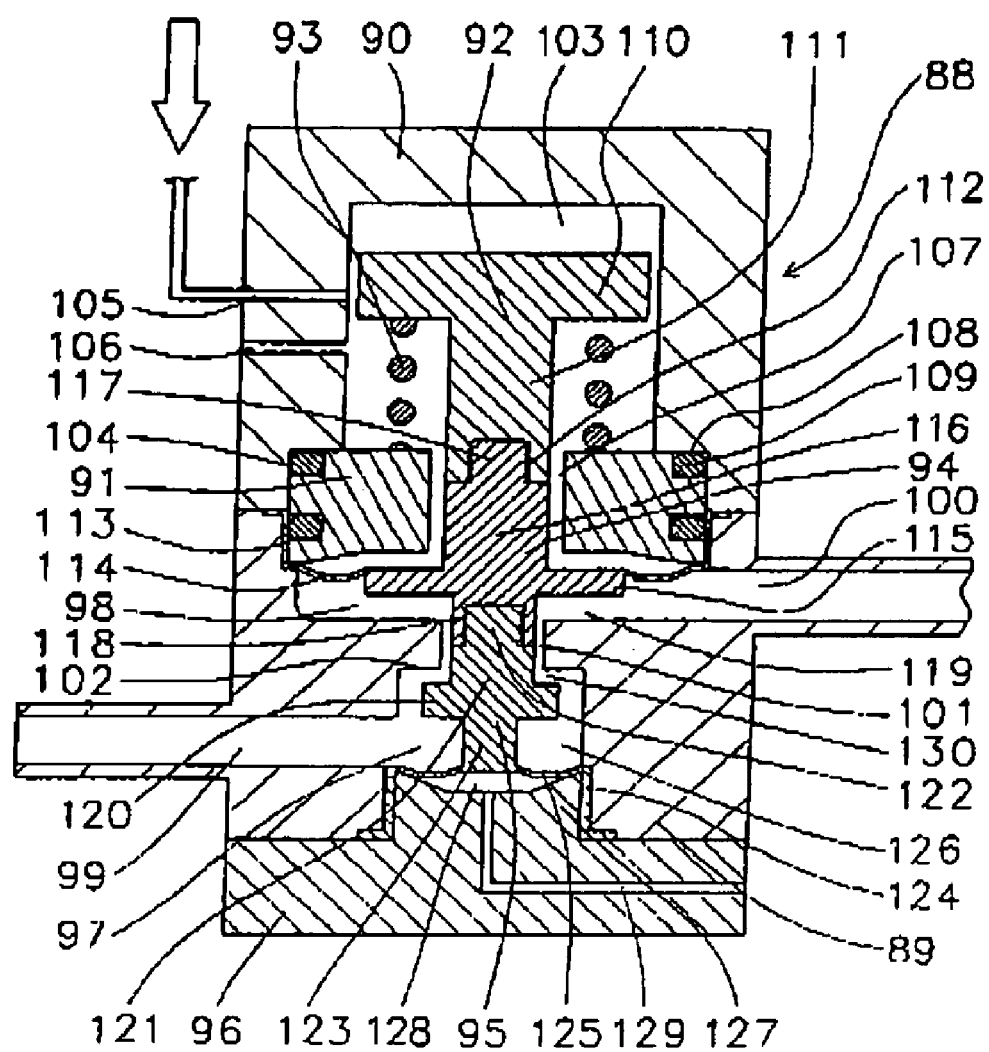
FIG. 6 is an enlarged view of essential components of the pressure control valve of FIG. 5.
Figure 7:
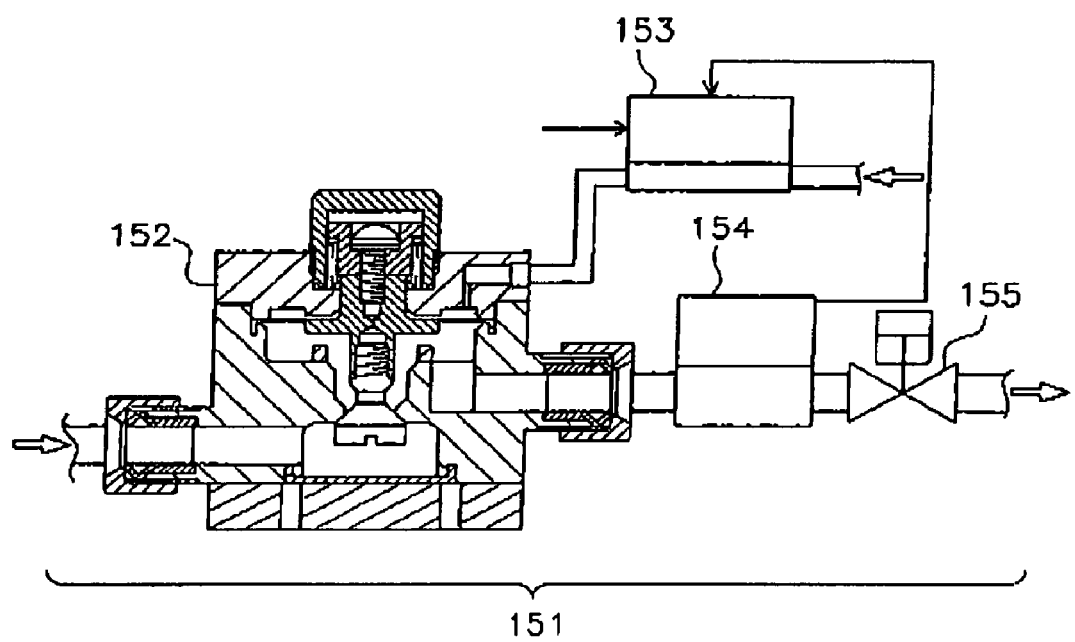
FIG. 7 is a conceptual diagram showing a conventional fluid controller of pure water.
Figure 8:
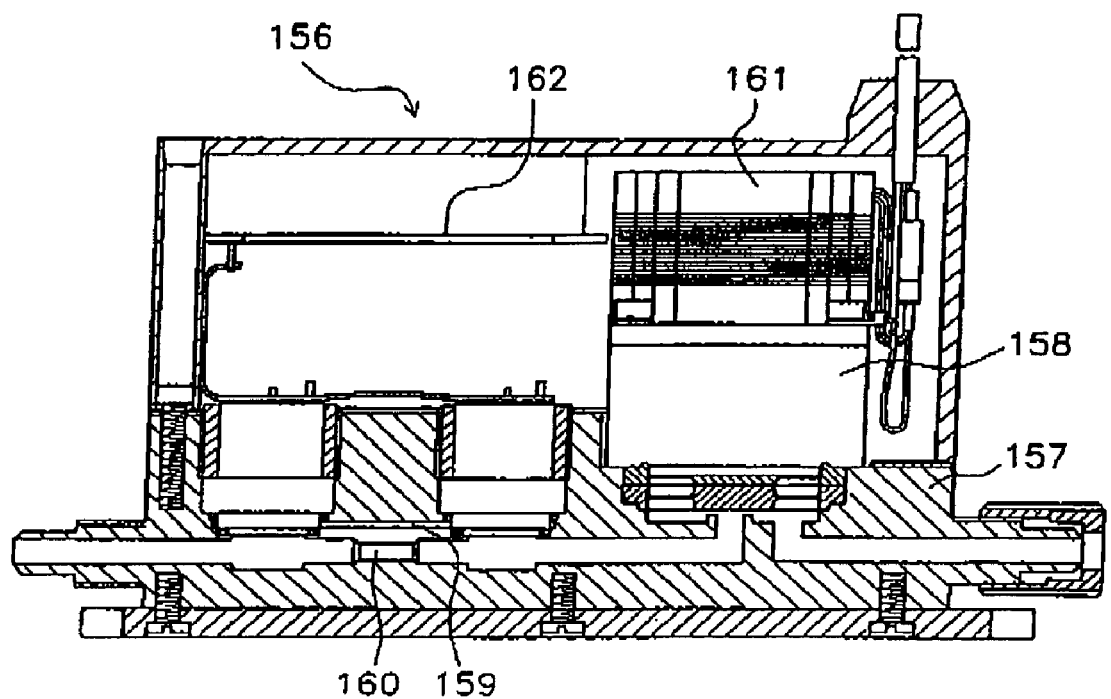
FIG. 8 is a partial cross-sectional view of a conventional fluid control module.

Embodiments of the present invention will be explained based on the embodiments shown in the drawing, but needless to say, the present invention is not restricted to these embodiments. FIG. 1 is a vertical cross-sectional view showing a first embodiment of the fluid controller according to the present invention. FIG. 2 is an enlarged view of essential components of the adjustment valve of FIG. 1. FIG. 3 is a vertical cross-sectional view showing a second embodiment of the flow controller according to the present invention. FIG. 4 is a cross-sectional view along the A-A line of FIG. 3. FIG. 5 is a partial vertical cross-sectional view showing the third embodiment of the fluid controller according to the present invention. FIG. 6 is an enlarged view of essential components of the pressure control valve of FIG. 5.

Embodiment 1

The first embodiment of a flow controller in accordance with the present invention will be explained with reference to FIGS. 1 and 2.

A valve module 1 comprises a casing 2, a fluid inlet 3, a flowmeter sensor section 4, an adjustment valve 5, and a fluid outlet 6, each of which is constituted as follows.

Casing 2 is a PVDF casing. In the inner portion of the casing 2, the flowmeter sensor section 4 and adjustment valve 5 are fixed to the bottom surface of the casing 2 by nuts and bolts (not shown), and provided in such a state that the fluid inlet 3, flowmeter sensor section 4, adjustment valve 5 and fluid outlet 6 are connected in series in such order. Further, in the casing 2 a connector box 50 (described below) is provided in a tightly sealed state. The flowmeter sensor section 4 and adjustment valve 5 may be provided in reverse order.

Fluid inlet 3 is a PTFE fluid inlet. The fluid inlet 3 communicates with an inflow channel 7 of the flowmeter sensor section 4.

Flowmeter section 4 is provided for measuring the flow rate of a fluid. The flowmeter sensor section 4 has the inflow channel 7 that communicates with the flow inlet 3, a first startup flow channel 8 extending orthogonally from the inflow channel 7, a linear flow channel 9 that communicates with the first startup flow channel 8 and is provided roughly parallel to the axis line of the inflow channel 7, a second startup flow channel 10 extending orthogonally from the linear flow channel 9, and an outlet channel 11 which communicates with the second startup flow channel 10 and is provided roughly parallel to the axis line of the inflow channel 7. At the positions where the side wall of the first and the second startup flow channels 8, 10 intersect with the axis of the liner flow channel 9, the first and second ultrasonic transducers 12, 13 are disposed opposite each other. The first and second ultrasonic transducers 12, 13 are covered with a fluorine resin, and wiring extending from the first and second ultrasonic transducers 12, 13 connect to the connectors 53, 54 within the connector box 50. Except for the ultrasonic transducers 12, 13 of the flowmeter sensor section 4, the flowmeter sensor section is made of PFA.

Adjustment valve 5 is provided for adjusting the flow rate of the fluid in accordance with the operating pressure. The adjustment valve 5 comprises a main body 14, a cylinder 15, a bonnet 16, a first diaphragm 17, a valve body 18, a second diaphragm 19, a rod 20, a diaphragm hold-down member 21 and a spring 22.

Main body 14 is a polytetrafluoroethylene (PTFE) main body provided with a cylindrical valve chamber 23 in the upper portion thereof, and in the lower portion thereof an inflow channel 24 and outflow channel 25 that respectively communicate with the valve chamber 23. At the valve chamber bottom center, there is an opening 26 that connects with the outflow channel 25, and at the periphery of the opening 26, an opening 27 that connects with the inflow channel 24. The opening 27 has a circular transverse cross-sectional shape, but when the opening 26 has been widened to control a flow across a large range, the opening 27 preferably has a roughly crescent shape formed centering around the opening 26 provided at the valve chamber bottom center. The main body 14 has in the upper surface thereof an annular groove 43 with which a seal of a first diaphragm 17 engages.

Cylinder 15 is a polyvinyl chloride (PVC) cylinder, and has a through-hole 28 in the center of the bottom part, a step section 48 in the bottom inner surface, and a ventilation hole 29 in a lateral surface. The cylinder 15 and main body 1 sandwich and fix a peripheral edge of the first diaphragm 17, and the cylinder 15 and a bonnet 16 sandwich and fix a peripheral edge of a second diaphragm 19 therebetween. The ventilation hole 29 in the lateral surface of the cylinder 15 is provided to discharge gas when a fluid in the form of a gas passes through the first diaphragm 17.

Bonnet 16 is a PVC bonnet, and is provided with a working fluid communication hole 30 at the top thereof so that air, oil or other working fluid can be introduced, and a discharge port 31. In this embodiment, the working fluid communication hole 30 is provided on the top part of the bonnet 16. Alternatively, the same can be provided on a lateral surface. Also, an annular groove 44, with which a seal section 40 of the second diaphragm 19 engages, is provided at the peripheral bottom thereof. The main body 14, cylinder 15 and bonnet 16 thus explained are integrally fixed to each other using nuts and bolts (not shown in the drawings).

First diaphragm 17 is a PTFE first diaphragm. With a shoulder section 32 as center, above the shoulder section 32 an attachment section 33 engaged with and fixed to a rod 20 and, below the shoulder section 32, a joining section 45 having a valve body 18 fixed thereto are integrally provided in a protruding manner, and on a portion radially extending from the shoulder section 32 there are provided a thin wall section 34, a thick wall section 35 which is continuous with the thin wall section 34, and a seal section 36 at the peripheral edge of the thick wall section 35, all of which are integrally formed. The thin wall section 34 is roughly one-tenth the thickness of the thick wall section 35. The rod 20 and attachment section 33 can be fixed to each other not only by engaging but also by screwing. It is preferable that the joining section 45 and valve body 18 be fixed by screwing. The seal section 36 positioned at the outer peripheral edge of the first diaphragm 17 has an L-shaped cross-section in the axial direction, and engages with the annular groove 43 of the main body 14 via an O-ring 49, and pressed by an annular protrusion 41 provided at the bottom of the cylinder 15, is thus sandwiched and fixed.

Valve body 18 is a PTFE valve body, and is screwed onto and fixed to the joining section 45 provided at the bottom of the first diaphragm 19. The valve body 18 is not limited to the shape described in the present embodiment, and a spherical valve body or conical valve body may be employed depending on the desired flow rate characteristics. Further, in order to fully close the valve in a state where a sliding resistance is reduced to the greatest extent possible, a valve body having outer periphery ribs is preferably used.

Second diaphragm 19 is an ethylene-propylene-diene copolymer (EPDM) second diaphragm having a central hole 37, a thick wall section 38 therearound, an annular protrusion 41 at an upper section of the thick wall, a thin wall section 39 radially extending from the thick wall section 38, and a seal section 40 provided at the peripheral edge of the thin wall section 39; at a shoulder section 42 at an upper section of the rod 19 fixed at its bottom with the attachment section 33 of the first diaphragm 17, the central hole 37 is penetrated by the diaphragm hold-down member 21, thereby sandwiching and fixing the second diaphragm. In the present embodiment, an EPDM material is employed. Alternatively, a fluoro-rubber or PTFE may also be employed.

Rod 20 is a PVC rod having at its upper section a shoulder section 42 with an enlarged diameter. Into the center of the shoulder section 42 a joining section 47 of the diaphragm hold-down member 21 is screwed, causing the second diaphragm 19 to be sandwiched and fixed. The lower section thereof is disposed with play in the through-hole 28 at the bottom of the cylinder 15, and the lower end is fixed to the attachment section 33 of the first diaphragm 17. Further, the spring 22 is engaged between the lower surface of the shoulder section 42 of the rod 20 and the step section 20 of the cylinder 15.

Diaphragm hold-down member 21 is a PVC diaphragm hold-down member, having at its lower surface center a joining section 47 that screwingly engages with the rod 20. Further, an annular groove 46 that engages with the annular protrusion 41 of the second diaphragm 19 is provided on the lower surface.

Spring 22 is an SUS spring, which is engaged and supported between the lower surface of the shoulder section 42 of the rod 20 and the step section 48 of the cylinder 15 in a state where radial movement is prevented. The spring 22 constantly impels the lower surface of the shoulder section 42 upwards. The spring 22 is entirely coated with a fluorine resin. The spring 22 can be used as appropriate with a different spring constant depending on the adjustment valve bore and the range of the pressure to be employed, or a plurality of springs may be used.

Fluid outlet 6 is a PTFE fluid outlet.

Connector box 50 is a PVDF connector box disposed in the casing 2 in a tightly sealed manner. The connector box 50 is provided with an intake port 51 that communicates with the casing 2, an exhaust hole 52 that communicates with the outside of the casing 2, and the intake port 51 is connected with the discharge port 31 of the adjustment valve 5 via a tube. In the connector box 50, connectors 53 and 54 connected to wiring leading from the ultrasonic transducers 12 and 13 are disposed and the connectors 53, 54 are detachably connected to the cables 64, 65 connected with wiring leading from the flowmeter amp section 58 of the electronics module 56 (described below).

Further, in the casing 2, an air connector 55 which is connected to the pipes extending to the working fluid communication hole 30 of the adjustment valve 5 is fixed so that the connecting portion protrudes from the exterior surface of the casing 2.

Electronics module 56 comprises a casing 57, flowmeter amp section 58, control section 59 and electropneumatic transducer 60. The constituent parts of the electronics module 56 are as follows.

The casing 57 is made of PVDF. The flowmeter amp section 58, control section 59 and electropneumatic transducer 60 are provided in a tightly sealed state in the inner portion of the casing 57. Further, in the casing 57 an inert gas or air from the electropneumatic is supplied to the transducer 60 from outside, and compressed air is supplied to the interior of the casing 57 from the electropneumatic transducer 60. In the figures, 67 is an exhaust port.

The flowmeter amp section 58 has a calculating section for calculating the flow rate from a signal output by the flowmeter sensor section 4. The calculating section is provided with a transmission circuit for outputting ultrasonic wave vibrations of uniform cycles to a first ultrasonic transducer 12 on the transmission side, a receiving circuit for receiving ultrasonic vibrations from the second ultrasonic transducer 13 of the receiving side, a comparison circuit for comparing the transport time of each ultrasonic wave vibration, and a calculating circuit for calculating the flow rate from difference in transport times output from the comparison circuit.

The control section 59 has a control circuit, which performs feedback control with respect to the flow rate output from the amp section 58 so that the flow rate becomes the set amount, and which controls the increase and decrease of the operating pressure of the electropneumatic transducer 60.

The electropneumatic transducer 60 adjusts the operating pressure of an inert gas or air. The electropneumatic transducer 60 comprises an electromagnetic valve for electrically driving the operating pressure to make proportional adjustments, and adjusts the operating pressure of the adjustment valve 5 in accordance with the control signal from the control section 59.

The connecting section of the connectors 61, 62 linked to the wiring running from the flowmeter amp section 58 are fixed to the casing 57 so that they protrude from the outside surface of the casing 57. Similarly, the connection part of an air connector 63 connected to the pipe running from the electropneumatic transducer 60 is also fixed so that it protrudes from the exterior surface of the casing 57.

The valve module 1 and electronics module 56 are divided into two separate units, with the connectors of the cables 64, 65 removably connected to the connectors 53, 54, 61 and 62 respectively of the valve module 1 and the electronics module 56, and with a tube 66 removably connected to the air connecters 55 and 63 respectively of the module 1 and electronics module 56. The present invention has two cables, but one may be used, in which case one connector is provided to each of the modules 1 and 56.

Next, the operation of the first embodiment of the present invention will be explained.

The fluid that flows in from the fluid inlet 3 of the valve module 1 first flows into the flowmeter sensor section 4. The fluid that flows into the flowmeter sensor section 4 is measured at the linear flow channel 9. Ultrasonic wave vibrations are propagated from the first ultrasonic transducer 12 positioned upstream of the fluid flow towards the second ultrasonic transducer 13 positioned downstream of the fluid flow. The ultrasonic vibration received by the second ultrasonic transducer 13 is converted into an electric signal, and output to the calculating section of the flowmeter amp section 58. Once the ultrasonic wave vibration is propagated from the first ultrasonic transducer 12 on the upstream side and received at the second ultrasonic transducer 13, there is instantaneous switching between transmission and reception within the calculating section, and the ultrasonic vibration is propagated to the first ultrasonic transducer positioned on the upstream side from the second ultrasonic transducer 13 positioned on the downstream side. The ultrasonic vibration received by the first ultrasonic transducer 12 is converted to an electric signal and output to the calculating section of the flowmeter amp section 58. Then, because the ultrasonic vibration goes against the flow of the fluid in the linear flow channel 9, the propagation speed of the ultrasonic vibration in the fluid is slow compared to the ultrasonic vibration propagated from the upstream side to the downstream side, and the propagation time lengthens. For the corresponding electrical signals that are output, the respective propagation times are measured inside the calculating section of the flowmeter amp section 58, and the flow rate is calculated from the difference of propagation times. The flow rate calculated by the flowmeter amp section 58 is converted into an electric signal and output to the control section 59.

Next, fluid that has passed through the flowmeter sensor section 4 flows into the adjustment valve 5. At the control section 59 a signal is output to the electropneumatic transducer 60 based on the deviation between a specified flow rate set in advance and the flow rate measured in real time to bring the deviation back to zero, and the electropneumatic transducer 60 supplies the adjustment valve 5 with the operating pressure in accordance with that output signal and drives the adjustment valve 5. The fluid flowing out from the adjustment valve 5 is controlled by the adjustment valve 5 so that the flow rate is a uniform value for a set flow rate, in other words, so that the deviation between the set flow rate and the measured flow rate is convergent at zero.

Operation of the adjustment valve 5 with respect to the operating pressure supplied from the electropneumatic transducer 60 will be explained.

The adjustment valve 5 is in a state where no compressed air is supplied from the working fluid communication hole 30 provided at the top of the bonnet 16, that is, it is in an opened state, where the flow of the fluid is at the maximum level. At this time, due to the repulsive force of the spring 22 engaged between the step section 48 of the cylinder 15 and the lower surface of the shoulder section 42 of the rod 20, the valve body 18 is stationary at a position where the upper section of the diaphragm hold-down member 21 joined with the upper section of the rod 20 comes in contact with and is stopped at the bottom surface of the bonnet 16.

In this state, when the pressure of the compressed air supplied from the working fluid communication hole 30 is increased, because the inside of the bonnet 16 is tightly sealed by the thin wall section 39 of the second diaphragm 19 the seal section 40 of which is engaged with the bonnet 16, and, by the bonnet 16, the compressed air presses the diaphragm hold-down member 21 and second diaphragm 19 downward, causing the valve body 18 to be inserted into the opening 26 via the rod 20 and the first diaphragm 17. Here, when pressure of the compressed air supplied from the working fluid communication hole 30 is made constant, the valve body 18 is stationary at a position where the repulsive force of the spring 22 is balanced with the pressure that the lower surface of the thin wall section 34 of the first diaphragm 17 and the lower surface of the valve body 18 receive from the fluid. Therefore, the opening area of the opening 26 is reduced by the inserted valve body 18, and the flow of the fluid is also reduced.

Further, when pressure of the compressed air supplied from the working fluid communication hole 30 is increased, the valve body 18 is pressed further downward, ultimately coming in contact with the opening 26 and reaching a fully closed state.

If the compressed air is discharged, the pressure inside the bonnet 16 tightly sealed by the thin wall section 39 of the second diaphragm 19, the seal section 40 of which is engaged with the bonnet 16, and by the bonnet 16 will decrease, and the rod 20 is pressed upwards as the impelling force of the spring 22, which is now stronger. The valve body 18 fixed via the first diaphragm 17 rises because the rod rises, and the adjustment valve enters an open state.

By the above operations, the fluid that flows into the fluid inlet 3 of the valve module 1 is controlled so as to be uniform at a set flow rate, and discharged from the fluid outlet 6. This ultrasonic flowmeter, comprising the flowmeter sensor section 4 and flowmeter amp section 58, can measure a flow rate accurately, even a minute flow rate, because it measures a flow rate from the difference in propagation time with respect to the flow direction of the fluid, and because the adjustment valve 5 is compact due to the above constitution, stable flow rate adjustments can be made, thus achieving the excellent effect of minute flow rate adjustments.

Next, in cases where the fluid used in the first embodiment of the present invention is a corrosive fluid, the action when a corrosive gas has passed through the interior of the valve module will be explained.

The fluid controller of the present invention is comprised of two separate parts, namely the valve module 1 and the electronics module 56. The parts on the inner portion of the valve module 1 will not corrode because they are covered with a fluorine resin resistant to corrosion, and corrosion of the ultrasonic transducers 12 and 13 can be prevented because they are covered with a fluorine resin, and corrosion of the spring 22 is also prevented because it is covered entirely with a fluorine resin. The connectors 53, 54 are parts in the inner portion of the valve module 1 that may corrode. However, because in the interior of the connector box 50, where the connectors 53, 54 are disposed, the compressed gas discharged from the discharge port 31 and supplied from the intake port 51 is constantly discharged outside of the casing 2, corrosive gas that has passed through flows out on that air stream and is discharged, and it does not remain in the connector box 50, thus preventing corrosion.

On the other hand, the electronics module 56 comprises parts that if corroded would affect flow rate measurements and flow control, but because the electronics module is constituted separately from the valve module 1, corrosion of the parts inside the electronics module 56 can be prevented by such parts being set in a position so as to be not directly affected by corrosive gases. Further, because the inner portion of the casing 57 is constantly discharging from the discharge port 67 by virtue of compressed air supplied to the inside of the casing 57 from the electropneumatic transducer 60, in the event that the electronics module 56 is set in a position where it will be affected by corrosive gasses, because the corrosive gas that has passed through rides on the air stream, the gas does not remain inside the casing 57. Thus, corrosion of the parts of the electronics module 56 can be prevented.

Next, the steps for installing the first embodiment of the present invention in a semiconductor manufacturing device will be explained.

First, the valve module 1 is disposed in a predetermined position on a pipe conduit inside the semiconductor manufacturing equipment, and the fluid inlet 3 and the fluid outlet 6 are connected with a pipe of the pipe conduit, and the valve module 1 is fixed to the inside of the semiconductor manufacturing equipment. The electronics module 56 is installed in a predetermined position apart from the pipe conduit inside the semiconductor manufacturing equipment. Next, the connectors of one end of the cables 64, 65 are inserted inside the connector box 50 of the valve module 1 and connected to the connectors 53 and 54, and the connectors of the other ends of the cables 64, 65 are connected to the connectors 61, 62 of the valve module 1. Next, one end of the tube 66 is inserted into and connected with the air connector 55 of the valve module 1, and the other end of a tube 66 is inserted into and connected with the air connector 63 of the electronics module 56. Using the above procedures, the installation to a semiconductor manufacturing device can be very easily carried out, and this can be performed easily and in a short time with only connecting the connectors for wiring and air piping connections. Further, with the constitution of the present invention, replacement is also easy, even if a part of the fluid controller breaks. Further, if a plurality of fluid controllers are installed, it is possible to manage fluid controllers of the present invention collectively by setting the electronics modules in the control box together.

The second embodiment of the flow controller relating to the present application will be explained based on FIGS. 3 and 4.

Embodiment 2

A flowmeter sensor 68 is installed in a casing 70 of the valve module 69. The flowmeter sensor section 68 has a linear flow channel 74 having an inflow channel 71, a vortex generation body 72 which generates a Karman vortex disposed orthogonally in the inflow channel 71, and an outflow channel 73, and the ultrasonic transducers 75 and 76 are disposed opposite each other in a position orthogonal to the flow channel axis direction on s side wall downstream of the vortex generation body 72 of the linear flow channel 74. The ultrasonic transducers 75, 76 are covered with a fluorine resin, and the wiring extending from the transducers 75 and 76 connects with connectors 78 and 79 inside the tightly sealed connector box 77. Other than the ultrasonic transducers 75, 76 of the flowmeter sensor 68, the flowmeter sensor 68 is made of PTFE.

A flowmeter amp section 80 is disposed in a casing 83 of an electronics module 82. The flowmeter amp section 80 is provided with a calculating section that finds the flow speed of a fluid flowing through the flow channel from the generated cycles (frequency) of a Karman vortex, and calculates the flow rate of the fluid. The calculating section has a transmission circuit for outputting ultrasonic vibrations of a uniform cycle to the ultrasonic transducer 75 on the transmission side, a receiving circuit for receiving ultrasonic vibrations from the ultrasonic transducer 76 on the receiving side, a comparison circuit which compares the phases of the ultrasonic vibrations, and a calculation circuit, which adds the Karman vortex detection signal output from the comparison circuit and calculates the flow rate. The connection part of the connectors 84, 85 connected to the wiring running from the flowmeter amp section 80 is fixed to the casing 83 so that they protrude from the exterior surface of the casing 83.

The valve module 69 and the electronics module 82 constitute two separate parts, with the connectors of the cables 86, 87 removably connected to connectors 78, 79, 84, and 85 respectively of the modules 69 and 82. Because other constituent elements in the second embodiment are the same as in the first embodiment, explanation thereof is omitted.

Next, the operation of the second embodiment of the present invention will be explained.

The fluid that flows into the valve module 69 first flows into the flowmeter sensor section 68. The fluid amount of the fluid flowed into the flowmeter sensor section 68 is measured at a linear flow channel 74. An ultrasonic vibration is propagated from one ultrasonic transducer 75 to the other ultrasonic transducer 76 with respect to the fluid flowing in the linear flow channel 74. A Karman vortex generated downstream of the vortex generation body 72 is generated at a cycle proportionate to the flow speed of the fluid, and because Karman vortices having different vortex directions are generated alternatingly, when an ultrasonic vibration passes through a Karman vortex, it is accelerated or decelerated to its traveling direction according to the vortex directions of the Karman vortices. Thus, the frequency (cycle) of the ultrasonic vibration received by the ultrasonic transducer 76 changes according to the Karman vortex. The ultrasonic vibrations transmitted and received by the ultrasonic transducers 75, 76 are converted to electric signals and output to the calculating portion of the flowmeter amp section 80. The flow rate of the fluid flowing into the linear flow channel 74 is calculated based on the frequency of the Karman vortex obtained from the phase difference between the ultrasonic vibration output from the ultrasonic transducer 75 on the transmitting side and the ultrasonic vibration output from the ultrasonic transducer 76 on the receiving side. The flow rate calculated by the flowmeter amp section 80 is converted to an electric signal and output to the control section 81. Because the operation of other parts of the second embodiment is the same as the first embodiment, explanation thereof is omitted.

Operations when the fluid used in the second embodiment is a corrosive fluid, and such corrosive gas has passed through the interior of the valve module, as well as the procedures for installing the fluid controller of the second embodiment in a semiconductor manufacturing device, are the same as in the first embodiment. Therefore, explanation thereof is omitted. The ultrasonic-type vortex flowmeter comprising the flowmeter sensor section 68 and flowmeter amp section 80 can accurately measure even a high flow rate because more Karman vortices are generated the higher the flow rate, thus resulting in the excellent effect of flow control of a high flow rate.

The following explains the third embodiment of the present invention based on FIGS. 5 and 6

Embodiment 3

A PTFE main body 89 includes a second air gap 97 provided at the center of the lower section and extending to the bottom section, a first air gap 98, which has a larger radius than the second air gap 97, provided at the upper section and extending to the top surface, an inflow channel 99 connected to the second air gap 97, an outflow channel 100 connected to the first air gap 98 on the surface opposite the inflow channel 99, and a communication hole 101 that connects the first air gap 98 and the second air gap 97 and has a smaller radius than the first air gap 98. The upper surface section of the second air gap 97 is a valve seat 102. Also, the main body 89 is connected to the fluid inlet 3 of the valve module 1.

A PVDF bonnet 90 includes a cylindrical air gap 103 on the inside section, a step section 104 having a wider radius than the air gap 103 on the inner periphery of the bottom end, and on a lateral surface, an air supply hole 105 that communicates with the air gap 103 and the outside so as to supply an inert gas or compressed air to the air gap 103, and an exhaust port 106 to discharge in minute amounts the inert gas or air introduced through the air supply hole 105.

A PVDF spring retainer 91 of a flat circular shape is provided, having a through-hole 107 at a central part thereof. The roughly upper half of the spring retainer 91 is fitted by insertion into a step section 104 of the bonnet 16. The side surface section of the spring retainer 91 is provided with an annular groove 108, and discharge of inert gas or air to outside of the bonnet 90 is prevented by the fitting of an O-ring 109.

A PVDF piston 92 is provided, having a first joining section 112 comprising a circular-shaped brim section 110 on the top section, a piston shaft 111 protruding from the central lower section of the brim section 110 in a cylindrical shape, and a female screw section provided on the bottom end of the piston shaft 111. The piston shaft 111 has a smaller diameter than that of the through-hole 107 of the spring retainer 91, and the first joining section 112 is joined by screwing to the second joining section 117 of the first valve mechanism body 94 (described below).

An SUS spring 93 is sandwiched between the lower end surface of the brim section 110 of the piston 92 and the upper end surface of the spring retainer 91. The spring 93 expands and contracts in concert with the up and down movements of the piston 92; therefore, a spring with a long free length is used suitably so as to keep the change of load at such time small.

A PTFE first valve mechanism body 94 is provided, comprising a first diaphragm 115, which has a film section 114 having a cylindrical section 113 provided protruding upwardly from the outside periphery thereof and a thick section in a center part of the diaphragm; a second joining section 117 comprising a male screw with a small radius provided at the top end part of the shaft section 116 so as to protrude from the center top surface of the first diaphragm 115; and a third joining section 118 screwed to a fourth joining section 122 of the second valve mechanism 95 (described below) comprising a female screw section provided so as to protrude from the center lower surface of the first diaphragm 115. Because the cylindrical section 113 of the first diaphragm 115 is sandwiched and fixed between the main body 89 and the spring retainer 91, the valve chamber 119, formed by the lower surface of the first diaphragm 115, is formed in a tightly sealed manner. The upper surface of the first diaphragm 115 and the air gap 103 of the bonnet 90 are tightly sealed via the O-ring 109, and a gas chamber is formed, which is filled with compressed inert gas or air provided through the air supply hole 105 of the bonnet 90.

A PTFE second valve mechanism body 95 comprises a valve body 120 disposed at an inner section of the second air gap 97 of the main body 89 and which is provided with a larger diameter than the communication hole 101. A shaft section 121 is provided so as to protrude from the top edge surface of the valve body 120. A fourth joining section 122 comprises a male screw part joined and fixed by screwing to the third joining section 118 provided to at a top edge thereof. A rod 123 is provided so as to protrude from the bottom edge of the valve body 120, and a second diaphragm 125 having a cylindrical protruding section 124 protruding from the periphery is further provided so as to extend radially from the bottom edge surface of the rod 123. The cylindrical protruding section 124 of the second diaphragm 125, because it is sandwiched between the protruding section 127 of the base plate 96 (described below) and the main body 89, tightly seals the second valve chamber 126 formed by the second air gap 97 of the main body 89 and the second diaphragm 125.

A PVDF base plate 96 is provided, having a protruding section 127 that with the main body 89 sandwiches and holds the cylindrical protruding section 124 of the second diaphragm 125 of the second valve mechanism body 95 at a center of the upper section of the PVDF base plate 96. A notched recess 128 is provided on a top end portion of the protruding section 127, and an intake port 129 communicating with the notched recess 128 is provided on a lateral surface. The PVDF base plate 96 and the bonnet 90 sandwich and hold the main body 89 with nuts and bolts (not shown).

The operation of the pressure control valve 88 will be explained. The valve body 120 of the second valve mechanism body 95 is subject to an upwardly impelling force due to by an impelling force of a spring 93 sandwiched between the brim section 110 of the piston 92 and the spring retainer 91 and due to the fluid pressure force on the bottom surface of the first diaphragm 115 of the first valve mechanism body 94; and a downward impelling force acts thereupon due to the pressure of the operating pressure on the upper surface of the first diaphragm 115. Further, the lower surface of the valve body 120 and the upper surface of the second diaphragm 125 of the second valve mechanism body 95 receive the fluid pressure force, but this force is almost entirely canceled out because the pressure-receiving surface area is substantially the same. Therefore, the valve body 120 of the second valve mechanism body 95 is stationary at a position where the above three forces are in balance.

Here, because when the operating pressure supplied from outside is increased, the pressure pressing down on the first diaphragm 115 increases, the opening surface area of the fluid control section 120 (sic) formed between the valve body 120 and the valve seat 102 of the second valve mechanism body 95 increases. Therefore, it is possible to increase the pressure of a first valve chamber 119. Conversely, when the operation pressure has been decreased, the opening surface area of the fluid control section 130 decreases and lowers the pressure. Therefore, the pressure can be set freely by adjusting the operation pressure.

In this state, if the fluid pressure on the upstream side is increased, the pressure in the first valve chamber 119 is also instantaneously increased. Then, the pressure on the bottom surface of the first diaphragm 115 from a fluid becomes greater than the force that the upper surface of the first diaphragm 115 receives from the compressed air by the operation pressure, and the first diaphragm 115 moves upward. Following this, because the position of the valve body 120 also moves upward, the opening surface area of the flow control section 130 formed between the valve seat 102 decreases and the pressure in the first valve chamber 119 decreases. Finally, the position of the valve body 120 is moved up to a position where the three forces are in balance, and the valve body 120 becomes stationary. Then, unless major changes are made to the load of the spring 93, because the pressure inside the air gap 103, that is, the force the upper surface of the first diaphragm 115 receives, is constant, the pressure the lower surface of the 115 is substantially uniform. Therefore, the fluid pressure on the bottom surface of the first diaphragm 115, that is, the pressure in the first valve chamber 119, is substantially the same pressure as the original pressure before the pressure on the upstream side increased.

If the fluid pressure on the upstream side decreases, the pressure in the first valve chamber 119 instantaneously decreases. If this is the case, the force that the bottom surface of the first diaphragm 115 receives from the fluid becomes smaller than the force that the top surface of the 115 receives from the compressed air by the operation pressure, and the first diaphragm 115 moves downward. Together with this, because the position of the valve body 120 also moves downward, the opening surface area of the fluid control section 130 formed between the valve seat 112 increases and the fluid pressure of the valve chamber 119 increases. Finally, the valve body 120 moves to a position with the three forces in balance and becomes stationary. Therefore, similarly to as when upstream side pressure is increased, the fluid pressure in the first valve chamber 119 is substantially the same as the original pressure. Through the above operations, because the pressure control valve 88 can control the fluid at a constant pressure, even if the fluid flowing in is a flow that has been pulsing at a quick pressure change cycle, stable pressure control can be performed and the flow rate of the fluid flowing in can be made constant.

The present invention, constituted as described above, demonstrates the following excellent effects.

(1) Because the valve module and electronics module are constituted separately into two modules, even if a corrosive gas passes through when a corrosive fluid is used as a fluid, the electronics module having parts that may corrode, is separated from the valve module through which the corrosive fluid is flowing, so there no corrosion.

(2) The parts that perform the fluid control are divided into a valve module and electronics module, and because they are connected detachably by wires via connectors, installation, piping and wiring connections in devices such as semiconductor manufacturing devices is easy and can be done in a short time, and each module can also be easily replaced.

(3) Using the adjustment valve with the constitution of the present invention enables a compact constitution and easy adjustment of the fluid amount, as well as adjustment of desired flow rates across a large range.

(4) By using an adjustment valve with the constitution of the present invention, the receiving pressure area of the thin wall section of the first diaphragm is significantly smaller than the receiving pressure surface area of the thin wall section of the second diaphragm, and thus inhibits influence from the pressure from a fluid of the inflow channel and inhibits hunting.

(5) The adjustment valve of the present invention has excellent fluid control responsiveness with respect to increase or decrease in the fluid amount in the pipes because the lower part of rod is engaged with play in the through-hole of the bottom part of the cylinder.

(6) By using the ultrasonic flowmeter with the constitution of the present invention, accurate and stable flow control can be performed when a fluid with a minute flow rate is flowing through.

(7) By using an ultrasonic-type vortex flowmeter with the constitution of the present invention, accurate and stable flow control can be performed when a fluid of a high flow rate is flowing through.

(8) By disposing a pressure control valve in an internal or external part of the valve module, because the fluid can be controlled at a constant pressure, stable pressure control can be performed and the flow rate of a fluid flowing in can be set at a constant value even if a flow of a fluid flowing in is pulsed by a fast pulse in a pressure variable cycle.

The invention claimed is:

1. A fluid controller; comprising:
a first single casing having a fluid inlet and fluid outlet;
a flowmeter sensor section including a first ultrasonic transducer that transmits ultrasonic waves throughout a fluid and a second ultrasonic transducer that receives ultrasonic waves transmitted from the first ultrasonic transducer and which outputs a signal;
a flowmeter amp section, which receives said signal; and
an adjustment valve for adjusting a flow rate of a fluid using operating pressure, at least the flowmeter sensor section and the adjustment valve being connected to each other in an interior of said first single casing, wherein the adjustment valve includes:
a main body integrally formed in said adjustment valve, said main body including a valve chamber at an upper portion thereof, an inflow channel and an outflow channel that respectively communicate with the valve chamber, and, at a bottom center of the valve chamber, an opening with which the outflow channel communicates;
a first diaphragm including a diaphragm shoulder section, an attachment section positioned above the shoulder section, a joining section positioned below the shoulder section, a thin wall section radially extending from the shoulder section, a thick wall section consecutive with the thin wall section, and a seal section provided at the peripheral edge of the thick wall section, all being integrally formed;
a cylinder including a through-hole at a bottom center thereof, and a ventilation hole in a lateral surface, the cylinder and the main body sandwiching and fixing said first diaphragm therebetween;
a rod having a rod shoulder section and an upper portion thereof, said rod being disposed such that a lower part thereof is located in the through-hole in the bottom of the cylinder with play, said cylinder including an internally configured step section, said rod being supported by a spring engaged between the step section of the cylinder and the bottom surface of the rod shoulder section of the rod in a state such that radial movement is prevented, the first diaphragm engaging with and fixing a bottom of said rod;
a second diaphragm including a central hole, and further comprising an integrally formed thick wall section around said central hole, a thin wall section radially extending from the thick wall section, and a seal section provided at a peripheral edge of the thin wall section, the second diaphragm being sandwiched and fixed by a diaphragm hold-down member that penetrates the central hole to the rod shoulder section positioned at the upper portion of the rod to a bottom of which the attachment section of the first diaphragm is attached;
a bonnet including a working fluid communication hole on the upper portion thereof, the bonnet and the cylinder sandwiching and fixing a peripheral edge of said second diaphragm therebetween, wherein the first diaphragm engages with and fixes the bottom of said rod;
a valve body, which enters and exits from the opening of the valve chamber in response to the vertical movement of the rod, being fixed to the joining section of the first diaphragm.

2. A fluid controller according to claim 1, further comprising:
a valve module comprising the flowmeter sensor section and the adjustment valve, said valve module being disposed in said first single casing;
a second single casing; and
an electronic module comprising the flowmeter amp section which calculates a flow volume using the signal of the flowmeter sensor section, an electropneumatic transducer which adjusts the operating pressure of the adjustment valve, and a control section which adjusts the operating pressure and performs feedback control based on the flow rate volume calculated by the flowmeter amp section, said electronic module being disposed in said second single casing.

3. A fluid controller according to claim 2, further comprising:
cables interconnecting the flowmeter sensor section of the valve module and the flowmeter amp section of the electronics module; and
connectors for detachably connecting the cables to the flowmeter sensor section and the flowmeter amp section.

4. A fluid controller according to claim 3, further comprising a connector box being disposed in a substantially sealed state in the first single casing housing the valve module said connector box including a ventilation hole that communicates with a discharge port of the adjustment valve and an exhaust hole that communicates with the exterior of the first single casing.

5. A fluid controller according to claim 1 or 2, comprising, in series:
an inflow channel that communicates with a fluid inlet;
a first startup flow channel extending orthogonally from the inflow channel;
a linear flow channel that communicates with the first startup flow channel and which is provided roughly parallel to the inflow channel;
a second startup flow channel extending orthogonally from the linear flow channel;
an outflow channel that communicates with the second startup flow channel being arranged roughly parallel to an axis line of the inflow channel, and which communicates with the inflow channel of the adjustment valve;
at a position of intersection with the axis line of the linear flow channel of a side wall of the first and second startup flow channels, said flowmeter comprising the flowmeter sensor section including the first and second ultrasonic transducers disposed so as to face each other; and
the flowmeter amp section to which the first and second ultrasonic transducers are connected via cables and which calculates the flow rate of the fluid flowing through the linear flow channel by alternatingly switching between transmitting and receiving signals of the first and second ultrasonic transducers and measuring a difference in ultrasonic wave propagation time between the respective ultrasonic transducers.

6. A fluid controller according to claim 1 or 2, wherein:
the flowmeter sensor section includes an ultrasonic-type vortex flowmeter, said vortex flowmeter being provided in series with an inflow channel which communicates with the fluid inlet, and a vortex generation body, which is provided orthogonally in the interior of the inflow channel and generates a Karman vortex, and a linear flow channel provided with an outflow channel; and at a side wall on a downstream side of the vortex generation body of the linear flow channel, the first and second ultrasonic transducers are disposed opposite each other at a position orthogonal to the flow channel axial direction and the flowmeter amp section to which the first and second ultrasonic transducers are connected via cables calculates a flow rate using a phase difference between a signal that said first ultrasonic transducer has transmitted and a signal that the second ultrasonic transducer has received for the generated frequency of the Karman vortex generated in the downstream of the vortex generation body.

7. A flow controller according to claim 2, wherein an inner portion of the second single casing housing the electronics module is substantially tightly sealed and has a discharge outlet used only for discharging air that has filled the inner portion of the second single casing.

8. A fluid controller according to having claim 1 or 2, further comprising a pressure control valve being disposed on an internal or external part of the fluid inlet of the first single casing.

* * * * *